United States Patent
Mo et al.

(10) Patent No.: US 10,833,683 B2
(45) Date of Patent: Nov. 10, 2020

(54) CLOCK GENERATOR

(71) Applicant: KOOKMIN UNIVERSITY INDUSTRY ACADEMY COOPERATION FOUNDATION, Seoul (KR)

(72) Inventors: Hyunsun Mo, Seoul (KR); Dae Jeong Kim, Seoul (KR)

(73) Assignee: KOOKMIN UNIVERSITY INDUSTRY ACADEMY COOPERATION GOUNDATION, Seoul (KR)

( * ) Notice: Subject to any disclaimer, the term of this patent is extended or adjusted under 35 U.S.C. 154(b) by 37 days.

(21) Appl. No.: 15/984,387

(22) Filed: May 20, 2018

(65) Prior Publication Data

US 2019/0058479 A1    Feb. 21, 2019

(30) Foreign Application Priority Data

Aug. 17, 2017    (KR) .................. 10-2017-0104278

(51) Int. Cl.
*H03L 7/085*    (2006.01)
*H03L 7/107*    (2006.01)
(Continued)

(52) U.S. Cl.
CPC .............. *H03L 7/085* (2013.01); *H03B 29/00* (2013.01); *H03C 3/0966* (2013.01);
(Continued)

(58) Field of Classification Search
CPC ..... H03L 7/00; H03L 7/06; H03L 7/08; H03L 7/0805; H03L 7/085; H03L 7/087;
(Continued)

(56) References Cited

U.S. PATENT DOCUMENTS 5,872,807 A    2/1999 Booth et al.
6,240,123 B1 *    5/2001 Zhang .................... H04B 15/04
                                                                375/130

(Continued)

OTHER PUBLICATIONS

Y.-B. Hsieh et al., "A Fully Integrated Spread-Spectrum Clock Generator by Using Direct VCO Modulation," IEEE Transactions on Circuits and Systems—I: Regular Papers, 2008, vol. 55, No. 7, pp. 1845-1853.

(Continued)

*Primary Examiner* — Diana J. Cheng
(74) *Attorney, Agent, or Firm* — Don D. Cha; HDC IP Law, LLP

(57) ABSTRACT

A clock generator including a phase frequency detector configured to compare a phase and a frequency of a reference clock signal with a phase and a frequency of a first output clock signal and generate a detection signal based on a difference in the phases and frequencies of the clock signals; a loop filter configured to generate a first control voltage signal based on the detection signal; a first voltage controlled oscillator configured to generate and output a first output clock signal based on the first control voltage signal, a modulation filter configured to generate a modulation voltage signal based on the reference clock signal and generate a second control voltage signal by combining the modulation voltage signal and the first control voltage signal, and a second voltage controlled oscillator configured to generate and output a second output clock signal based on the second control voltage signal is provided.

9 Claims, 4 Drawing Sheets

(51) Int. Cl.
*H03L 7/16* (2006.01)
*H03L 7/093* (2006.01)
*H03L 7/08* (2006.01)
*H03L 7/089* (2006.01)
*H03B 29/00* (2006.01)
*H03C 3/09* (2006.01)
*H04B 15/04* (2006.01)

(52) U.S. Cl.
CPC .......... *H03L 7/0805* (2013.01); *H03L 7/0893* (2013.01); *H03L 7/093* (2013.01); *H03L 7/1072* (2013.01); *H03L 7/16* (2013.01); *H04B 15/04* (2013.01)

(58) Field of Classification Search
CPC ..... H03L 7/089; H03L 7/0891; H03L 7/0893; H03L 7/093; H03L 7/10; H03L 7/107; H03L 7/1072; H03L 7/16; H03B 29/00; H03C 3/02; H03C 3/09; H03C 3/0908; H03C 3/0916; H03C 3/0966
See application file for complete search history.

(56) References Cited

U.S. PATENT DOCUMENTS

2001/0055151 A1* 12/2001 Ookubo ................. G01Q 20/02
                                                                    359/368
2006/0056491 A1*  3/2006 Lim ...................... H03L 7/0805
                                                                    375/130

OTHER PUBLICATIONS

H. Mo et al., "A spread-spectrum clock generator with direct VCO modulation in open-loop," IEICE Electronics Express, Advance Publication, Aug. 9, 2017, pp. 1-8, 2017.

* cited by examiner

CLOCK GENERATOR

CROSS-REFERENCE TO RELATED APPLICATION

This application claims priority to and the benefit of Korean Patent Application No. 2017-0104278, filed on Aug. 17, 2017, the disclosure of which is incorporated herein by reference in its entirety.

BACKGROUND

1. Field of the Disclosure

The present disclosure relates to a clock generator, in particular, to a spread spectrum clock generator.

2. Discussion of Related Art

Recently, as the operating frequency and the number of data input bits of various information devices are increasing, electromagnetic interference (EMI) is conspicuously generated by a high frequency clock signal generated from a voltage controlled oscillator (VCO), which is an internal block of a clock generator necessary for controlling data timing at data transmission terminals of interfaces, thereby causing a peripheral circuit to malfunction.

Among the various means proposed to reduce the electromagnetic interference phenomenon, a spread spectrum clock generator (SSCG) is known as a means to effectively reduce the EMI phenomenon by reducing power density of an output frequency of the output clock signal using the spread spectrum of the output clock signal frequency.

Here, the spread spectrum clock generator is a circuit that receives a reference clock signal from an external source and outputs a clock signal, the frequency of which frequency varies at a predetermined modulation frequency and a modulation ratio.

The above-described spread spectrum clock generator deliberately and finely modulates the frequency of the clock signal, so that the peak power of the clock signal can be dispersed and decreased at a predetermined frequency, and the electromagnetic wave emission can be reduced.

FIG. 1 is a block diagram illustrating a conventional spread spectrum clock generator.

As illustrated in FIG. 1, the conventional spread spectrum clock generator includes a phase frequency detector (PFD) 10, first to third charge pumps ($CP_1$, $CP_2$, and $CP_3$) 21, 22, and 23, a voltage controlled oscillator 40, a clock divider (D) 50, a loop filter, and a modulation filter.

The phase frequency detector 10, the first charge pump 21, the loop filter, the voltage controlled oscillator 40, and the clock divider 50 are basic components of the clock generator, while the second and third charge pumps 22 and 23 and the modulation filter are components provided for spread modulation of the spectrum of an output clock signal $CLK_{out}$.

In the conventional spread spectrum clock generator, a modulation filter is provided within a clock generator having a closed loop structure.

Hereinafter, circuit features of the conventional spread spectrum clock generator will be described.

Since the frequency shift value of the clock signal $CLK_{out}$, with respect to a modulation voltage signal $V_m$ generated by the modulation filter is determined by the loop filter, the bandwidth thereof is limited.

Since the modulation filter is located inside the clock generator having a closed loop structure, the loop filter behaves like a high-pass filter (HPF). That is, for the modulation voltage signal $V_m$, to be transmitted to the loop filter, the bandwidth must be much smaller than the frequency of the modulation voltage signal $V_m$.

Here, to make the bandwidth smaller than the frequency of the modulation voltage signal $V_m$, the resistance value of the first resistor ($R_1$) must be increased or the capacitance value of the second capacitor ($C_2$) must be increased. An increase in the resistance value of the first resistor $R_1$ may cause an additional ripple noise in the clock generator, therefore, the capacitance of the second capacitor ($C_2$) is increased to solve the problem of the bandwidth limitation.

However, when the capacitance of the second capacitor ($C_2$) is increased compared to an increase in the resistance value of the first resistor ($R_1$), the chip area is further increased, so that a clock generator having a small chip area cannot be realized. That is, the clock generator cannot be integrated on an on-chip type, which is problematic.

SUMMARY OF THE DISCLOSURE

An object of the present disclosure is to provide a clock generator that can reduce electromagnetic interference (EMI) by reducing the power density of a clock signal using spread spectrum of a clock signal frequency.

In addition, an object of the present disclosure is to provide a clock generator capable of minimizing the influence of electromagnetic waves on a human body when a clock generator according to an embodiment of the present disclosure is mounted on a wearable device, such as a healthcare product, used in close contact with a human body.

In addition, an object of the present disclosure is to provide a clock generator capable of selectively or simultaneously using different types of clock signals as required.

In addition, an object of the present disclosure is to realize a clock generator having a small chip area, and prevent formation of ripple noise in the clock generator.

The technical objects to be achieved by the present disclosure are not limited to the technical matters described above, and other technical objects which are not mentioned can be clearly understood by a person having ordinary skills in the art from the following description.

In order to solve the above-mentioned problems, provided is a clock generator, which includes a phase frequency detector configured to compare a phase and a frequency of a reference clock signal with a phase and a frequency of a first output clock signal and generate a detection signal based on a difference in the phases and frequencies of the clock signals; a loop filter configured to generate a first control voltage signal based on the detection signal; a first voltage controlled oscillator configured to generate and output a first output clock signal based on the first control voltage signal; a modulation filter configured to generate a modulation voltage signal based on the reference clock signal and generate a second control voltage signal by combining the modulation voltage signal and the first control voltage signal; and a second voltage controlled oscillator configured to generate and output a second output clock signal based on the second control voltage signal.

Wherein, the first output clock signal may be a non-spread spectrum clock signal, and the second output clock signal may be a spread spectrum clock signal.

In addition, the clock generator may further include a first charge pump configured to generate a first charge pumping current corresponding to the detection signal.

In addition, the loop filter may generate a first control voltage signal corresponding to a first charge pumping current.

In addition, the loop filter may have a low pass filter feature.

In addition, the clock generator may further include a second charge pump configured to generate a second charge pumping current based on the reference clock signal.

In addition, the modulation filter may generate the modulation voltage signal by integrating a second charge pumping current.

In addition, the modulation filter may have a high-pass filter feature.

In addition, the clock generator may further include a first clock divider configured to divide the first clock signal by a predetermined division ratio and output the divided clock signal to the first clock divider.

In addition, the clock generator may further include a second clock divider configured to divide the reference clock signal by a predetermined division ratio and output the divided clock signal to the second charge pump, In addition, the modulation filter may include a buffer configured to transmit the first control voltage signal to the modulation filter to combine the modulation voltage signal and the first control voltage signal.

According to the present disclosure, it is possible to reduce electromagnetic interference (EMI) phenomenon by reducing the power density of a clock signal using spread spectrum of a clock signal frequency.

In addition, according to the present disclosure, when a clock generator is mounted on a wearable device, such as a healthcare product, used in close contact with a human body, the influence of electromagnetic waves on the human body can be minimized.

In addition, according to the present disclosure, a single clock generator can generate and output different types of clock signals, such as a non-spread spectrum clock signal and a spread spectrum clock signal, so that the clock signals can be used selectively or simultaneously as required.

In addition, according to the present disclosure, a clock generator having a small chip area can be realized.

In addition, according to the present disclosure, it is possible to prevent formation of ripple noise in a clock generator.

The effects of the present disclosure are not limited to the mentioned above, and other effects which are not mentioned can be clearly understood by a person having ordinary skills in the art from the following description.

DETAILED DESCRIPTION OF EXEMPLARY EMBODIMENTS

Figure 1:
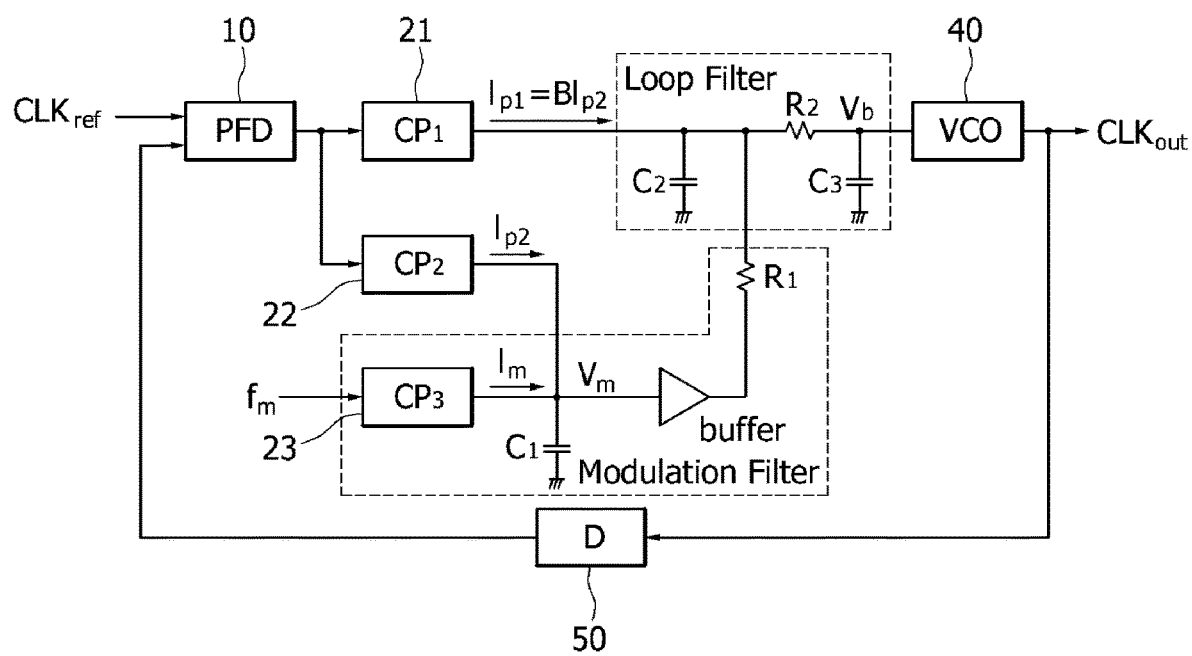
FIG. 1 is a block diagram illustrating a conventional spread spectrum clock generator.

Exemplary embodiments of the present disclosure will be described in detail with reference to the accompanying drawings. The same or similar elements are denoted by the same reference numerals regardless of the reference numerals, and redundant description thereof will be omitted.

In addition, in the following description, well-known functions or constructions are not described in detail since they would obscure the disclosure in unnecessary detail. It is to be noted that the accompanying drawings are only for the purpose of facilitating understanding of the present disclosure and should not be construed as limiting the scope of the present disclosure with reference to the accompanying drawings.

Figure 2:
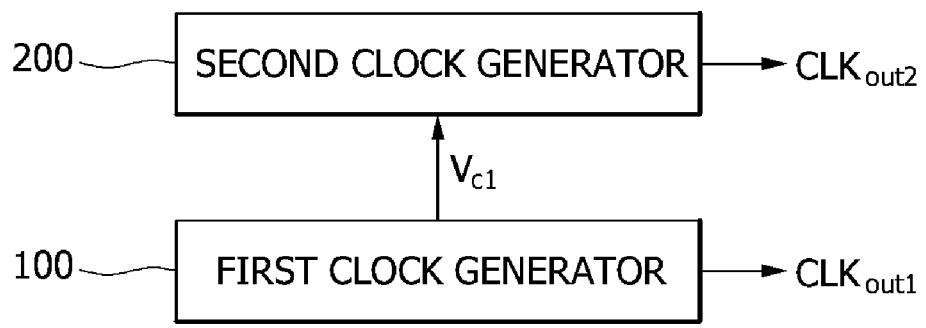
FIG. 2 is a schematic block diagram illustrating a clock generator according to an embodiment of the present disclosure.
Figure 3:
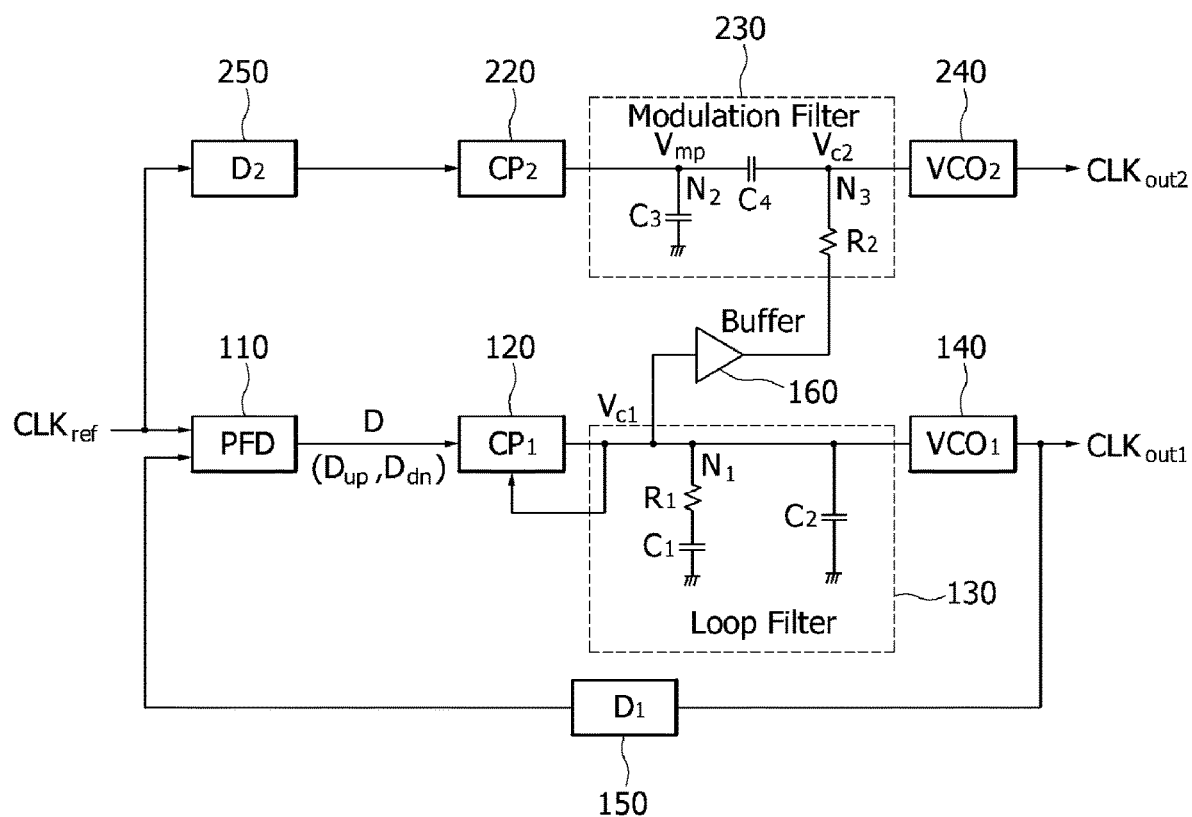
FIG. 3 is a detailed block diagram illustrating the clock generator according to an embodiment of the present disclosure.

FIG. 2 is a schematic block diagram illustrating a clock generator according to an embodiment of the present disclosure, and FIG. 3 is a detailed block diagram illustrating the clock generator according to an embodiment of the present disclosure.

As illustrated in FIG. 2, a clock generator according to an embodiment of the present disclosure includes a first clock generator 100 for generating and outputting a first output clock signal $CLK_{out1}$ and a second clock generator 200 for generating and outputting a second output clock signal $CLK_{out2}$.

The first output clock signal $CLK_{out1}$ is a non-spread spectrum clock signal without spread spectrum modulation, and the second output clock signal ($CLK_{out2}$) is a spread spectrum clock signal subjected to spread spectrum modulation.

The second clock generator 200 receives a first voltage control signal $V_{c1}$ generated by the first clock generator 100 and generates a second output clock signal $CLK_{out2}$ based on the first voltage control signal $V_{c1}$. The first voltage control signal ($V_{c1}$) is generated by the second clock generator 200, based on the first output clock signal $CLK_{out1}$ fed back thereto.

The first clock generator 100 has a closed loop structure and the second clock generator 200 has an open loop structure. Specifically, the first clock generator 100 has a closed loop structure because the first clock generator 100 outputs a clock signal having a fixed phase by receiving the first output clock signal $CLK_{out1}$ fed back thereto. The second clock generator 200 has an open loop structure because the second clock generator 200 outputs a clock signal subjected to spread spectrum modulation by receiving the first control voltage signal $V_{c1}$ generated by the first clock generator 100 as an input.

As illustrated in FIG. 3, the clock generator according to an embodiment of the present disclosure may include a phase frequency detector (PFD) 110, a first charge pump ($CP_1$) 120, a loop filter 130, a voltage controlled oscillator ($VCO_1$) 140, a second charge pump ($CP_2$) 220, a modulation filter 230, and a second voltage controlled oscillator ($VCO_2$) 240.

The phase frequency detector 110, the first charge pump 120, the loop filter 130, and the voltage controlled oscillator 140 may be included in the above-mentioned first clock generator 100, and the second charge pump 220, the modulation filter 230 and the second voltage controlled oscillator 240 may be included in the above-mentioned second clock generator 200.

The phase frequency detector 110 receives the first output clock signal $CLK_{out1}$ output from the first voltage controlled oscillator ($VCO_1$) as an input, i.e. a feedback signal, and receives a reference clock signal $CLK_{ref}$ from an external source. The phase frequency detector 110 compares the phase and frequency of the reference clock signal $CLK_{ref}$ with those of the first output clock signal $CLK_{out1}$ to generate a detection signal D corresponding to the difference.

In particular, the phase frequency detector 110 generates an up-detection signal $D_{up}$ or a down-detection signal $D_{dn}$ corresponding to the phase-frequency difference between the reference clock signal $CLK_{ref}$ and the first output clock signal $CLK_{out1}$. The up-detection signal $D_{up}$ and the down-detection signal $D_{dn}$ are pulse signals activated in accordance with the phase frequency relationship between the reference clock signal $CLK_{ref}$ and the first output clock signal $CLK_{out1}$.

The first charge pump 120 generates a first charge pumping current $I_{cp1}$ corresponding to the detection signal D generated in the phase frequency detector 110. The first charge pump 120 may have a self-bias structure.

In particular, the first charge pump 120 generates a first charge pumping current $I_{cp1}$ having positive polarity (+) by performing a positive charge pumping operation in response to the up-detection signal $D_{up}$ while generating a first charge pumping current $I_{cp1}$ having negative polarity (−) by performing a negative charge pumping operation in response to the down-detection signal $D_{dn}$.

The first charge pump 120 supplies charges to the loop filter 130 in response to the up-detection signal $D_{up}$ and subtracts the charges from the loop filter 130 in response to the down-detection signal $D_{dn}$.

The loop filter 130 generates the first control voltage signal $V_{c1}$ based on the detection signal D generated by the phase frequency detector 110. The loop filter 130 generates the first control voltage signal $V_{c1}$ corresponding to the first charge pumping current $I_{cp1}$ generated by the first charge pump 120.

In particular, the loop filter 130 may include a first capacitor ($C_1$), a second capacitor ($C_2$), and a first resistor ($R_1$). Here, the first capacitor ($C_1$) and the first resistor ($R_1$) are connected in series and may be connected between a first node ($N_1$) and a ground terminal. The second capacitor ($C_2$) may be connected between the first node ($N_1$) and the ground terminal.

The loop filter 130 charges the second capacitor ($C_2$) with charges supplied by the positive charge pumping operation of the first charge pump 120 and generates the first control voltage signal $V_{c1}$ corresponding to the charges. The loop filter 130 discharges the second capacitor ($C_2$) by the amount of charges discharged by the negative charge pumping operation generates the first control voltage signal $V_{c1}$ corresponding to the charges.

In other words, the voltage level of the first control voltage signal $V_{c1}$ is increased by a charging operation of the first charge pump 120 and the voltage level is decreased by a discharging operation of the first charge pump 120.

The detection signal (D) generated by the phase frequency detector 110 may include a direct current (DC) component and a harmonic component. Since the components necessary for fixing the phase of the clock signal are a DC component and a lower-frequency harmonic component, higher-frequency harmonic components of the detection signal D need to be removed.

As described above, the loop filter 130 has a low pass filter (LPF) feature to remove a harmonic component from the detection signal (D). Here, the first capacitor ($C_1$) and the first resistor ($R_1$) connected in series may perform a low pass filter function.

The first voltage controlled oscillator 140 generates the first output clock signal $CLK_{out1}$ based on the first control voltage signal $V_{c1}$ generated by the loop filter 130, and outputs the generated first output clock signal $CLK_{out1}$. Then the first voltage controlled oscillator 140 outputs the generated first output clock signal $CLK_{out1}$ to the phase frequency detector 110 to fix the phase of a next output clock signal.

Here, the first voltage controlled oscillator 140 generates a first output clock signal $CLK_{out1}$ having a frequency corresponding to the voltage level of the first control voltage signal $V_{c1}$.

The first clock generator 100 may further include a first clock divider $D_1$ 150. The first clock divider 150 divides the first output clock signal $CLK_{out1}$ generated by the first voltage controlled oscillator 140 at a predetermined division ratio and outputs the result to the phase frequency detector 110.

Here, the frequency division ratio of the first clock divider 150 is an important factor for determining the frequency of the first output clock signal $CLK_{out1}$.

For example, when the frequency of the reference clock signal $CLK_{ref}$ is 25 MHz and the division ratio is 60, the frequency of the first output clock signal $CLK_{out1}$ is 1.5 GHz.

Since detailed circuit configurations of the phase frequency detector 110, the first charge pump 120, the first voltage controlled oscillator 140, and the first clock divider 150 are well known in the art, detailed descriptions thereof will be omitted.

The first control voltage signal $V_{c1}$ is transmitted to the second clock generator 200, which will be described later.

In this regard, the clock generator according to an embodiment of the present disclosure may further include a buffer 160 for transmitting a first control voltage signal $V_{c1}$ generated by the loop filter 130 to the modulation filter 230.

The first voltage controlled oscillator 140, for example, generates a first output clock signal $CLK_{out1}$ having a low frequency corresponding to a first control voltage signal $V_{c1}$ having a high voltage level and generates a first output clock signal $CLK_{out1}$ having a high frequency corresponding to a first control voltage signal $V_{c1}$ having a low voltage level.

A frequency relationship between a voltage level of a first control voltage signal $V_{c1}$ and a first output clock signal $CLK_{out1}$ may vary depending on the design. It is possible to generate a first output clock signal $CLK_{out1}$ having a low frequency corresponding to a first control voltage signal $V_{c1}$ having a low voltage level and to generate a first output clock signal $CLK_{out1}$ having a high frequency corresponding to a first control voltage signal $V_{c1}$ having a high voltage level.

The first clock divider 150 divides the first output clock signal $CLK_{out1}$ at a predetermined division ratio and outputs the result to the phase frequency detector 110, and the phase frequency detector 110 re-detects the phase frequency difference between the reference clock signal $CLK_{ref}$ and the frequency-changed first output clock signal $CLK_{out1}$.

The first clock generator 100 generates and outputs a first output clock signal $CLK_{out1}$ synchronized with the reference clock signal $CLK_{ref}$ while repeatedly performing the above-described operation.

The second charge pump 220 generates a second charge pumping current $I_{cp2}$ based on the reference clock signal $CLK_{ref}$. The second charge pump 220 may have a non-self-bias structure, unlike the first charge pump 120.

The modulation filter 230 may include a third capacitor ($C_3$), a fourth capacitor ($C_4$), and a second resistor ($R_2$). Here, the third capacitor ($C_3$) may be connected between a second node ($N_2$) and the ground terminal, the second resistor ($R_2$) may be connected between a third node $N_3$ and the buffer 160, and the fourth capacitor ($C_4$) may be connected between the second node $N_2$ and the third node $N_3$.

The modulation filter 230 generates a modulation voltage signal $V_m$ based on the reference clock signal $CLK_{ref}$. The third capacitor ($C_3$) of the modulation filter 230 generates the modulation voltage signal $V_m$ by integrating a second charge pumping current $I_{cp2}$ generated by the second charge pump 220.

The modulation filter 230 generates a second control voltage signal $V_{c2}$ by combining the generated modulation voltage signal $V_m$ with the first control voltage signal $V_{c1}$ received from the buffer 160.

The second clock generator 200 may further include a second clock divider ($D_2$) 250.

The second clock divider 250 divides a reference clock signal $CLK_{ref}$ received from an external source at a predetermined division ratio and outputs the divided clock signal $CLK_{ref}$ to the second charge pump 220. Then, the second charge pump 220 generates a second charge pumping current $I_{cp2}$ corresponding to the divided reference clock signal $CLK_{ref}$.

The reference clock signal $CLK_{ref}$ divided by the second clock divider 250 may include a DC component and a harmonic component. Since the components necessary for the spread spectrum of the clock signal are higher-frequency harmonic components, the DC component and the lower-frequency harmonic component, among the divided reference clock signal $CLK_{ref}$, need to be removed.

As described above, the modulation filter 230 has a high-pass filter (HPF) feature to remove a DC component and a lower-frequency harmonic component from the divided reference clock signal $CLK_{ref}$. Here, the fourth capacitor ($C_4$) and the second resistor ($R_2$) may perform a high-pass filter function.

The second voltage controlled oscillator 240 generates and outputs a second output clock signal $CLK_{out2}$ based on the second control voltage signal $V_{c2}$ generated by the modulation filter 230. Specifically, the second voltage controlled oscillator 240 generates the second output clock signal $CLK_{out2}$ having a frequency corresponding to the voltage level of the second control voltage signal $V_{c2}$.

Since the detailed circuit configurations of the second charge pump 220, the second voltage controlled oscillator 240, and the second clock divider 250 are well known in the art, detailed descriptions thereof will be omitted.

Hereinafter, the operation of the second clock generator 200 will be described.

The second clock divider 250 divides a reference clock signal $CLK_{ref}$ and outputs the divided reference clock signal $CLK_{ref}$ to the second charge pump 220.

The second charge pump 220 generates a second charge pumping current $I_{cp2}$ based on the divided reference clock signal $CLK_{ref}$.

Here, the divided reference clock signal $CLK_{ref}$ may have a square waveform in which the high level and the low level are repeated. In this case, the second charge pumping current $I_{cp2}$ generated by the second charge pump 220 also has a square waveform.

The modulation filter 230 generates a modulation voltage signal $V_{mp}$ in the form of a triangular wave by integrating the square wave formed current supplied from the second charge pump 220. Here, the modulation voltage signal $V_{mp}$ is filtered by the modulation filter 230 to generate $V_m$, so that only high-frequency harmonic components remain.

In addition, the modulation filter 230 receives a first control voltage signal $V_{c1}$ through the buffer 160, and generates a second control voltage signal $V_{c2}$ by combining the received first control voltage signal $V_{c1}$ with the modulation voltage signal $V_m$.

The second voltage controlled oscillator 240 generates and outputs a second output clock signal $CLK_{out2}$ corresponding to the voltage level of the second control voltage signal $V_{c2}$. Here, the second output clock signal $CLK_{out2}$ is converted into a clock signal subjected to spread spectrum modulation.

As described above, the clock generator according to an embodiment of the present disclosure can reduce an electromagnetic interference (EMI) by reducing the power density of a clock signal using the spread spectrum of the clock signal frequency.

In addition, when the clock generator according to an embodiment of the present disclosure is mounted on a wearable device, such as a healthcare product, used in close contact with a human body, the influence of electromagnetic waves on the human body can be minimized.

In addition, the clock generator according to an embodiment of the present disclosure is advantageous in that a single clock generator can generate and output different types of clock signals, such as a non-spread spectrum clock signal and a spread spectrum clock signal, so that the clock signals can be used selectively or simultaneously as required.

Figure 4:
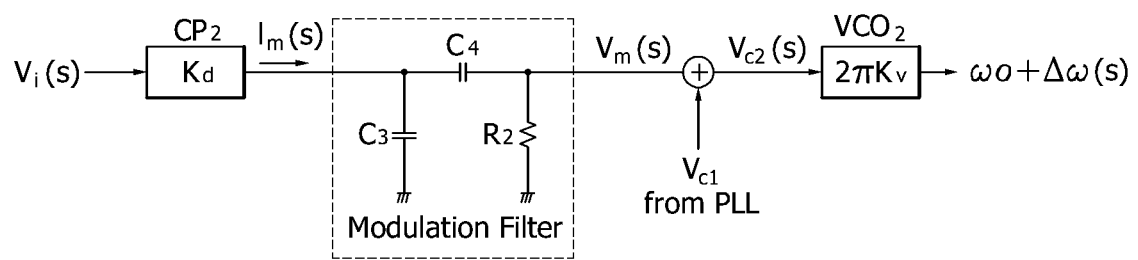
FIG. 4 is a drawing illustrating a linear model of the clock generator according to an embodiment of the present disclosure.

FIG. 4 is a drawing illustrating a linear model of the clock generator according to an embodiment of the present disclosure.

Hereinafter, the circuit features of the clock generator according to the embodiment of the present disclosure will be described with reference to FIG. 4.

Formula 1 below represents a transfer function of the frequency shift value $\Delta\omega(s)$ of a second output clock signal $CLK_{out2}$ with respect to a modulation voltage signal $V_m(s)$.

$$\frac{\Delta\omega(s)}{V_m(s)} = 2\pi K_v \qquad \text{Formula 1}$$

Referring to Formula 1 above, the frequency shift value $\Delta\omega(s)$ of the second output clock signal $CLK_{out2}$ with respect to the modulation voltage signal $V_m(s)$ has no bandwidth limitation, due to all-pass filter features thereof, where $K_v$ is the VCO gain.

Formula 2 below represents a transfer function of a modulation voltage signal $V_m(s)$ for a second charge pumping current $I_{cp2}(s)$, which corresponds to the modulation currents $I_m(s)$.

$$\frac{V_m(s)}{I_m(s)} = \frac{\frac{1}{C_3}}{s + \frac{1}{R_2}\left(\frac{1}{C_3} + \frac{1}{C_4}\right)}, \omega_c = \frac{1}{R_2}\left(\frac{1}{C_3} + \frac{1}{C_4}\right) \qquad \text{Formula 2}$$

Referring to formula 2 above, the modulation voltage signal $V_m(s)$ for the second charge pumping current $I_{cp2}(s)$ has a low pass filter feature.

The cutoff frequency $\omega_c$ must be much smaller than the frequency $\omega_m$ of the modulation voltage signal $V_m$ so that the second charge pumping current $I_{cp2}$ is integrated to form the modulation voltage signal $V_m$ in the form of a triangular wave.

Here, a resistance value of the second resistor ($R_2$) must be increased or the capacitance of the third capacitor ($C_3$) or the fourth capacitor ($C_4$) must be increased to make the cutoff frequency $\omega_c$ lower than the frequency of the modulation voltage signal $V_m$.

When the capacitance of the third capacitor ($C_3$) or the fourth capacitor ($C_4$) is made larger than the resistance value of the second resistor ($R_2$), the chip area is further increased.

According to embodiments of the present disclosure the third capacitor ($C_3$) and fourth capacitor ($C_4$) can have relatively small values of capacitance by increasing the resistance value of the second resistor ($R_2$), it is possible to realize a clock generator having a small chip area. Therefore, the clock generator can be integrated as an on-chip type.

In this case, since the second clock generator 200 has an open loop structure and is located outside of the first clock generator 100, the ripple noise of the first clock generator 100 is not formed even in the case in which the resistance value of the second resistor $R_2$ is increased as described above.

The embodiments described in the present specification and the accompanying drawings are merely illustrative of some of the technical spirit of the present disclosure. Therefore, it is obvious that the embodiments disclosed in the present specification are intended to be illustrative rather than limiting the technical spirit of the present disclosure, and the scope of the technical spirit of the present disclosure is not limited by these embodiments. Modifications and specific examples that can be readily devised by a person having ordinary skills in the art within the scope of the technical idea suggested in the specification and drawings of the present disclosure are to be construed as being embraced within the scope of the present disclosure.

What is claimed is:

1. A clock generator, comprising:
   a phase frequency detector configured to compare a phase and a frequency of a reference clock signal with a phase and a frequency of a first output clock signal and generate a detection signal based on a difference in the phases and frequencies of the clock signals;
   a loop filter configured to generate a first control voltage signal based on the detection signal;
   a first voltage controlled oscillator configured to generate and output a first output clock signal based on the first control voltage signal;
   a modulation filter configured to generate a modulation voltage signal based on the reference clock signal and generate a second control voltage signal by combining the modulation voltage signal and the first control voltage signal; and
   a second voltage controlled oscillator configured to generate and output a second output clock signal based on the second control voltage signal,
   wherein the modulation filter is a high-pass filter ("HPF") consisting of a resistor and a capacitor, and wherein the modulation filter removes a direct current (DC) component and a lower-frequency harmonic component from the reference clock signal, and wherein the first control voltage signal is input to the resistor and the modulation voltage signal is input to the capacitor.

2. The clock generator of claim 1, wherein the first output clock signal is a non-spread spectrum clock signal, and the second output clock signal is a spread spectrum clock signal.

3. The clock generator of claim 1, further comprising a first charge pump configured to generate a first charge pumping current corresponding to the detection signal.

4. The clock generator of claim 1, wherein the loop filter generates a first control voltage signal corresponding to a first charge pumping current.

5. The clock generator of claim 1, further comprising a second charge pump configured to generate a second charge pumping current based on the reference clock signal.

6. The clock generator of claim 5, further comprising a clock divider configured to divide the reference clock signal by a predetermined division ratio and output the divided clock signal to the second charge pump.

7. The clock generator of claim 1, wherein the modulation filter generates the modulation voltage signal by integrating a second charge pumping current.

8. The clock generator of claim 1, wherein the modulation filter comprises high-pass filter features.

9. The clock generator of claim 1, wherein the modulation filter comprises a buffer configured to transmit the first control voltage signal to the modulation filter to combine the modulation voltage signal and the first control voltage signal.

* * * * *